United States Patent
Kobayashi et al.

(10) Patent No.: US 12,248,959 B2
(45) Date of Patent: Mar. 11, 2025

(54) BATTERY REPLACEMENT CONTROL DEVICE AND BATTERY REPLACEMENT CONTROL SYSTEM

(71) Applicant: TOYOTA JIDOSHA KABUSHIKI KAISHA, Toyota (JP)

(72) Inventors: Jun Kobayashi, Obu (JP); Takahiro Okano, Chiryu (JP); Mitsuyoshi Ohno, Miyoshi (JP); Nobuhiro Nakano, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 18/378,682

(22) Filed: Oct. 11, 2023

(65) Prior Publication Data
US 2024/0144310 A1 May 2, 2024

(30) Foreign Application Priority Data
Oct. 28, 2022 (JP) .................................. 2022-173408

(51) Int. Cl.
| | |
|---|---|
| *G06Q 30/00* | (2023.01) |
| *B60L 53/62* | (2019.01) |
| *B60L 53/80* | (2019.01) |
| *G06Q 30/0208* | (2023.01) |
| *G06Q 50/06* | (2012.01) |
| *B60S 5/06* | (2019.01) |

(52) U.S. Cl.
CPC .......... *G06Q 30/0208* (2013.01); *B60L 53/62* (2019.02); *B60L 53/80* (2019.02); *G06Q 50/06* (2013.01); *B60S 5/06* (2013.01)

(58) Field of Classification Search
None
See application file for complete search history.

(56) References Cited

U.S. PATENT DOCUMENTS

| | | | |
|---|---|---|---|
| 2015/0127479 A1* | 5/2015 | Penilla | B60L 53/31 705/305 |
| 2018/0222343 A1 | 8/2018 | Uchida | |
| 2019/0197608 A1 | 6/2019 | Iwai et al. | |
| 2021/0046829 A1 | 2/2021 | Gaither et al. | |

(Continued)

FOREIGN PATENT DOCUMENTS

| | | |
|---|---|---|
| CN | 110015108 A | 7/2019 |
| JP | 2014-056589 A | 3/2014 |
| JP | 2018-128769 A | 8/2018 |

(Continued)

OTHER PUBLICATIONS

Wu, Hao. "A survey of battery swapping stations for electric vehicles: Operation modes and decision scenarios." IEEE Transactions on Intelligent Transportation Systems 23.8 (2021): 10163-10185. (Year: 2021).*

(Continued)

*Primary Examiner* — Michael Bekerman
(74) *Attorney, Agent, or Firm* — Dinsmore & Shohl LLP

(57) ABSTRACT

A server (battery replacement management server) includes: a communication unit (acquisition unit) that acquires number-of-users information (situation information) in a battery replacement apparatus; and a processor (control unit) that adjusts, based on the situation information, an incentive given to a user of the battery replacement apparatus.

10 Claims, 14 Drawing Sheets

(56) References Cited

U.S. PATENT DOCUMENTS

2022/0126725 A1   4/2022   Wang et al.
2024/0078570 A1 * 3/2024   Hirohata ................. B60L 58/13

FOREIGN PATENT DOCUMENTS

| KR | 20230063303 A * | 8/2022 | |
| WO | WO-2022004307 A1 * | 1/2022 | ............. B60L 50/60 |
| WO | WO-2022023818 A1 * | 2/2022 | ............. G06Q 20/18 |
| WO | WO-2023211377 A1 * | 11/2023 | |

OTHER PUBLICATIONS

Ahmad, Furkan, et al. "Battery swapping station for electric vehicles: opportunities and challenges." IET Smart Grid 3.3 (2020): 280-286. (Year: 2020).*

Infante, William, et al. "Optimal recourse strategy for battery swapping stations considering electric vehicle uncertainty." IEEE Transactions on Intelligent Transportation Systems 21.4 (2019): 1369-1379. (Year: 2019).*

Comelli, Andrea. Battery Swapping Systems—From a business oriented analysis to a practical case study. Diss. Politecnico di Torino, 2020. (Year: 2020).*

* cited by examiner

FIRST BATTERY REPLACEMENT
APPARATUS

| TIME PERIOD | NUMBER OF RESERVED VEHICLES |
|---|---|
| 14:00-15:00 | 4 VEHICLES |
| 15:00-16:00 | 5 VEHICLES |
| 16:00-17:00 | 3 VEHICLES |
| ⋮ | ⋮ |

SECOND BATTERY REPLACEMENT
APPARATUS

| TIME PERIOD | NUMBER OF RESERVED VEHICLES |
|---|---|
| 14:00-15:00 | 2 VEHICLES |
| 15:00-16:00 | 6 VEHICLES |
| 16:00-17:00 | 3 VEHICLES |
| ⋮ | ⋮ |

AVERAGE VALUE OF NUMBER OF
USERS OF PAST WEEK

| TIME PERIOD | NUMBER OF USERS |
|---|---|
| MORNING | 12 VEHICLES |
| AFTERNOON | 18 VEHICLES |

BATTERY REPLACEMENT CONTROL DEVICE AND BATTERY REPLACEMENT CONTROL SYSTEM

CROSS REFERENCE TO RELATED APPLICATIONS

This nonprovisional application is based on Japanese Patent Application No. 2022-173408 filed on Oct. 28, 2022 with the Japan Patent Office, the entire contents of which are hereby incorporated by reference.

BACKGROUND

Field

The present disclosure relates to a battery replacement control device and a battery replacement control system.

Description of the Background Art

Japanese Patent Laying-Open No. 2018-128769 discloses a battery replacement support system for replacing a secondary battery mounted on a vehicle.

SUMMARY

Here, replacement of a battery of a vehicle may be performed at a battery replacement apparatus (battery station). In this case, a user of the vehicle uses the most accessible (the nearest, for example) battery replacement apparatus. Thus, depending on the situation (crowdedness, for example) of the battery replacement apparatus, it may be difficult to accept users (vehicles), or it may be desired that the apparatus be used by more users (vehicles). Therefore, it is desired to enable the use of a battery replacement apparatus by a user to be adjusted depending on the situation of the battery replacement apparatus.

The present disclosure was made to solve such a problem, and has an object to provide a battery replacement control device and a battery replacement control system that can enable the use of a battery replacement apparatus by a user to be adjusted depending on the situation of the battery replacement apparatus.

A battery replacement control device according to a first aspect of the present disclosure is a battery replacement control device that manages at least one battery replacement apparatus including at least one battery interchangeable with a battery mounted on an electric vehicle, the battery mounted on the electric vehicle being a first battery and the at least one battery being a second battery. The battery replacement control device includes: an acquisition unit that acquires situation information about a situation in the battery replacement apparatus; and a control unit that adjusts, based on the situation information, an incentive given to a user of the battery replacement apparatus.

In the battery replacement control device according to the first aspect of the present disclosure, the incentive given to the user of the battery replacement apparatus is adjusted based on the situation in the battery replacement apparatus, as described above. Thus, the use (the number of users) of the battery replacement apparatus can be readily adjusted by the adjustment of the incentive. As a result, the use of the battery replacement apparatus can be readily adjusted based on the situation in the battery replacement apparatus.

In some embodiments, in the battery replacement control device according to the first aspect, the situation information includes number-of-users information about a number of the users. With such a configuration, the incentive can be adjusted based on the number of the users of the battery replacement apparatus. As a result, the number of the users of the battery replacement apparatus can be readily adjusted.

In some embodiments, in this case, the number-of-users information includes information about a reservation status of use of the battery replacement apparatus. With such a configuration, the number of the users of the battery replacement apparatus can be accurately detected based on the reservation status of the battery replacement apparatus.

In some embodiments, in the battery replacement control device in which the situation information includes the number-of-users information, the number-of-users information includes information about a number of the electric vehicles around the battery replacement apparatus. With such a configuration, the number of the users of the battery replacement apparatus can be readily detected based on the number of the electric vehicles around the battery replacement apparatus.

In some embodiments, in the battery replacement control device in which the situation information includes the number-of-users information, the at least one battery replacement apparatus includes a first battery replacement apparatus and a second battery replacement apparatus. The acquisition unit acquires the number-of-users information for each of the first battery replacement apparatus and the second battery replacement apparatus. The control unit makes the incentive corresponding to one of the first battery replacement apparatus and the second battery replacement apparatus having a smaller number of the users larger than the incentive corresponding to the other of the first battery replacement apparatus and the second battery replacement apparatus having a larger number of the users. With such a configuration, the number of the users of a battery replacement apparatus, which has been determined to have a relatively small number of the users, can be readily increased by the adjustment of the incentive. As a result, variation in the number of the users between the first battery replacement apparatus and the second battery replacement apparatus can be suppressed.

In some embodiments, in the battery replacement control device in which the situation information includes the number-of-users information, the control unit makes the incentive when the number of the users is smaller than or equal to a predetermined first threshold value larger than the incentive when the number of the users is larger than the predetermined first threshold value. With such a configuration, the number of the users of a battery replacement apparatus, which has been determined to have a relatively small number of the users that is smaller than or equal to the predetermined first threshold value, can be readily increased by the adjustment of the incentive.

In some embodiments, in the battery replacement control device in which the situation information includes the number-of-users information, the number-of-users information includes a history of the number of the users in a first time period, and a history of the number of the users in a second time period. The control unit makes the incentive corresponding to one of the first time period and the second time period having a smaller number of the users larger than the incentive corresponding to the other of the first time period and the second time period having a larger number of the users. With such a configuration, the number of the users of the battery replacement apparatus in a time period, which has been determined to have a relatively small number of the users of the battery replacement apparatus, can be readily increased by the adjustment of the incentive. As a result, variation in the number of the users of the battery replacement apparatus between the first time period and the second time period can be suppressed.

In some embodiments, in the battery replacement control device according to the first aspect, the situation information includes information that the battery replacement apparatus is required to charge the second battery using power from a power system, and information about an SOC of the second battery. The control unit makes, when a number of the second batteries having a full SOC is larger than or equal to a predetermined second threshold value, the incentive when an SOC of the electric vehicle is smaller than or equal to a predetermined third threshold value larger than the incentive when the SOC of the electric vehicle is larger than the predetermined third threshold value. With such a configuration, when the number of the second batteries having a full SOC is larger than or equal to the predetermined second threshold value and is relatively large, the number of processes of battery replacement by electric vehicles having a relatively low SOC can be readily increased. As a result, the number of the first batteries having a low SOC that are stored in the battery replacement apparatus increases, and therefore, the request to charge the battery using power from the power system can be readily met.

In some embodiments, in the battery replacement control device according to the first aspect, the situation information includes information about an SOC of the second battery. The control unit makes the incentive when a number of the second batteries having a full SOC is larger than or equal to a predetermined fourth threshold value larger than the incentive when the number of the second batteries having a full SOC is smaller than the predetermined fourth threshold value. Such a configuration can readily increase the frequency of use of a battery replacement apparatus having a relatively large number of the second batteries having a full SOC.

In some embodiments, in the battery replacement control device according to the first aspect, the situation information includes information about an amount of power being used to charge the second battery. The control unit makes the incentive when the amount of power is smaller than or equal to a predetermined fifth threshold value larger than the incentive when the amount of power is larger than the predetermined fifth threshold value. Here, a small amount of power being used to charge the second battery means a large number of fully charged second batteries. Therefore, the frequency of use of a battery replacement apparatus having a relatively large number of the second batteries having a full SOC can be readily increased.

A battery replacement control system according to a second aspect of the present disclosure includes: an electric vehicle on which a first battery is mounted; at least one battery replacement apparatus including at least one second battery interchangeable with the first battery; and a battery replacement control device that manages the battery replacement apparatus. The battery replacement control device includes an acquisition unit that acquires situation information about a situation in the battery replacement apparatus, and a control unit that adjusts, based on the situation information, an incentive given to a user of the battery replacement apparatus.

In the battery replacement control system according to the second aspect of the present disclosure, the incentive given to the user of the battery replacement apparatus is adjusted based on the situation in the battery replacement apparatus, as described above. Thus, a battery replacement control system can be provided that can readily adjust the use of a battery replacement apparatus based on the situation in the battery replacement apparatus.

The foregoing and other objects, features, aspects and advantages of the present disclosure will become more apparent from the following detailed description of the present disclosure when taken in conjunction with the accompanying drawings.

DESCRIPTION OF THE EMBODIMENTS

Figures 1, 2:
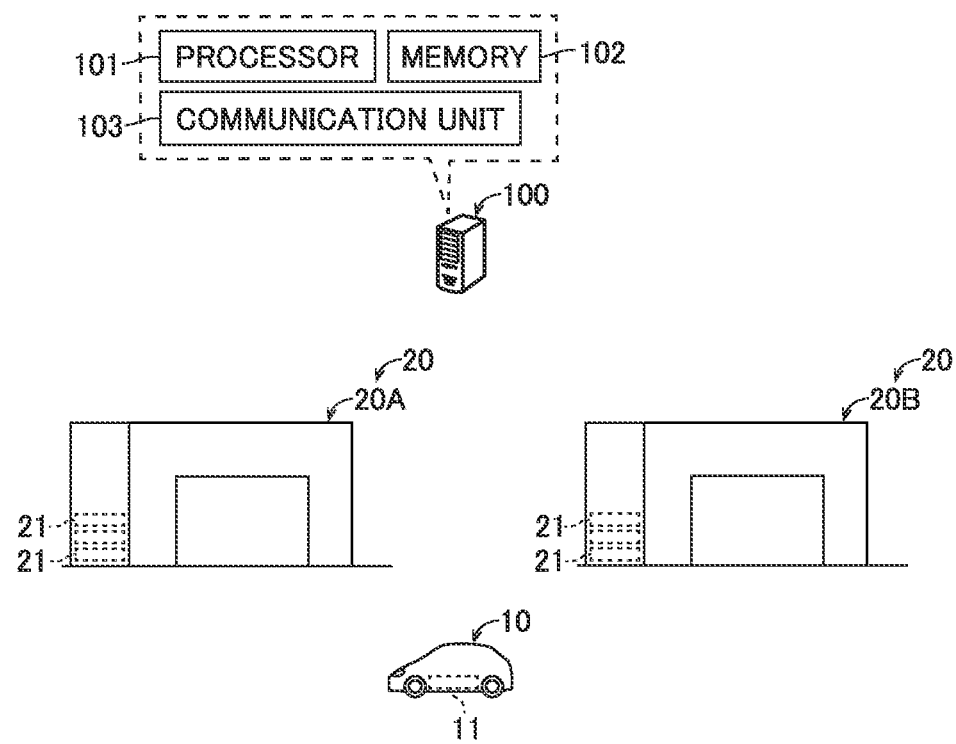
FIG. 1 shows a configuration of a system according to a first embodiment.
FIG. 2 shows a relationship between a time period and the number of reserved vehicles in each of first and second battery replacement apparatuses.

Embodiments of the present disclosure will be described in detail below with reference to the drawings. The same or corresponding portions in the drawings are denoted by the same reference characters and description thereof will not be repeated.

First Embodiment

FIG. 1 shows a configuration of a system 1 according to a first embodiment. System 1 includes a server 100, a plurality of battery replacement apparatuses 20, and an electric vehicle 10. Although only one electric vehicle 10 is illustrated in FIG. 1, system 1 may be provided with a plurality of electric vehicles 10. Server 100 manages each of the plurality of battery replacement apparatuses 20. Note that server 100 and system 1 are one example of "battery replacement control device" and one example of "battery replacement control system" of the present disclosure, respectively.

Electric vehicle 10 is provided with a battery 11. Note that battery 11 is one example of "first battery" of the present disclosure.

Electric vehicle 10 includes, for example, a plug-in hybrid electric vehicle (PHEV), a battery electric vehicle (BEV), and a fuel cell electric vehicle (FCEV). Electric vehicle 10 may include a data communication module (DCM), or a 5G (fifth-generation mobile communications system)-enabled communication I/F.

Battery replacement apparatus 20 includes a plurality of batteries 21 that are interchangeable with battery 11. Electric vehicle 10 has battery 11 replaced with battery 21 in battery replacement apparatus 20. Note that battery 21 is one example of "second battery" of the present disclosure.

The plurality of battery replacement apparatuses 20 include a first battery replacement apparatus 20A and a second battery replacement apparatus 20B. First battery replacement apparatus 20A and second battery replacement apparatus 20B have the same configuration. Note that the plurality of battery replacement apparatuses 20 may include three or more battery replacement apparatuses 20.

Server 100 is also configured to manage information about registered electric vehicle 10 (hereinafter also referred to as "vehicle information") and information about each registered user (hereinafter also referred to as "user information"). The user information and the vehicle information are distinguished by identification information (ID) and stored in a memory 102 to be described later.

Vehicle ID is identification information to identify electric vehicle 10. The vehicle ID may be a license plate or a vehicle identification number (VIN). The vehicle information includes an operation schedule of each electric vehicle 10.

Server 100 includes a processor 101, memory 102, and a communication unit 103. Processor 101 controls communication unit 103. Memory 102 stores, in addition to programs for execution by processor 101, information (maps, mathematical formulas, and various parameters, for example) for use in the programs. Note that processor 101 and communication unit 103 are one example of "control unit" and one example of "acquisition unit" of the present disclosure, respectively.

Communication unit 103 of server 100 communicates with each of the plurality of battery replacement apparatuses 20 and electric vehicle 10. Communication unit 103 includes various types of communication I/Fs.

Server 100 (communication unit 103) also acquires information about a reservation status of use of each of the plurality of battery replacement apparatuses 20. The user of electric vehicle 10 makes a reservation to use first battery replacement apparatus 20A or second battery replacement apparatus 20B through the Internet. Communication unit 103 acquires the information about the reservation status stored on the Internet. Note that the information about the reservation status is one example of "situation information" and "number-of-users information" of the present disclosure.

As shown in FIG. 2, for example, communication unit 103 acquires information about the number of reserved vehicles (the number of users) for each of first battery replacement apparatus 20A and second battery replacement apparatus 20B in each time period.

Here, a user of a vehicle uses the most accessible (the nearest, for example) battery replacement apparatus. Thus, depending on the situation (crowdedness, for example) of the battery replacement apparatus, it may be difficult to accept users (vehicles), or it may be desired that the apparatus be used by more users (vehicles). Therefore, it is desired to enable the use of a battery replacement apparatus by a user to be adjusted depending on the situation of the battery replacement apparatus.

Accordingly, in the first embodiment, processor 101 adjusts, based on the information about the reservation status, an incentive given to the user of battery replacement apparatus 20. The incentive includes, for example, granting points that can be used for shopping and the like, or programs that can be installed on electric vehicle 10 and the user's terminal. The incentive may also include a discount from the fee normally charged for battery replacement.

Processor 101 makes the incentive corresponding to one of first battery replacement apparatus 20A and second battery replacement apparatus 20B having a smaller number of users larger than the incentive corresponding to the other of first battery replacement apparatus 20A and second battery replacement apparatus 20B having a larger number of users.

In the example shown in FIG. 2, in a time period between 14:00 and 15:00, the number of users (4 vehicles) of first battery replacement apparatus 20A is larger than the number of users (2 vehicles) of second battery replacement apparatus 20B. Therefore, when making a reservation for battery replacement in the time period between 14:00 and 15:00, the incentive for using second battery replacement apparatus 20B is made larger than the incentive for using first battery replacement apparatus 20A.

In a time period between 15:00 and 16:00, the number of users (6 vehicles) of second battery replacement apparatus 20B is larger than the number of users (5 vehicles) of first battery replacement apparatus 20A. Therefore, when making a reservation for battery replacement in the time period between 15:00 and 16:00, the incentive for using first battery replacement apparatus 20A is made larger than the incentive for using second battery replacement apparatus 20B.

In a time period between 16:00 and 17:00, the number of users (3 vehicles) of first battery replacement apparatus 20A is equal to the number of users (3 vehicles) of second battery replacement apparatus 20B. Therefore, when making a reservation for battery replacement in the time period between 16:00 and 17:00, the incentive for using first battery replacement apparatus 20A is made equal to the incentive for using second battery replacement apparatus 20B.

(Sequence Control)

Figure 3:
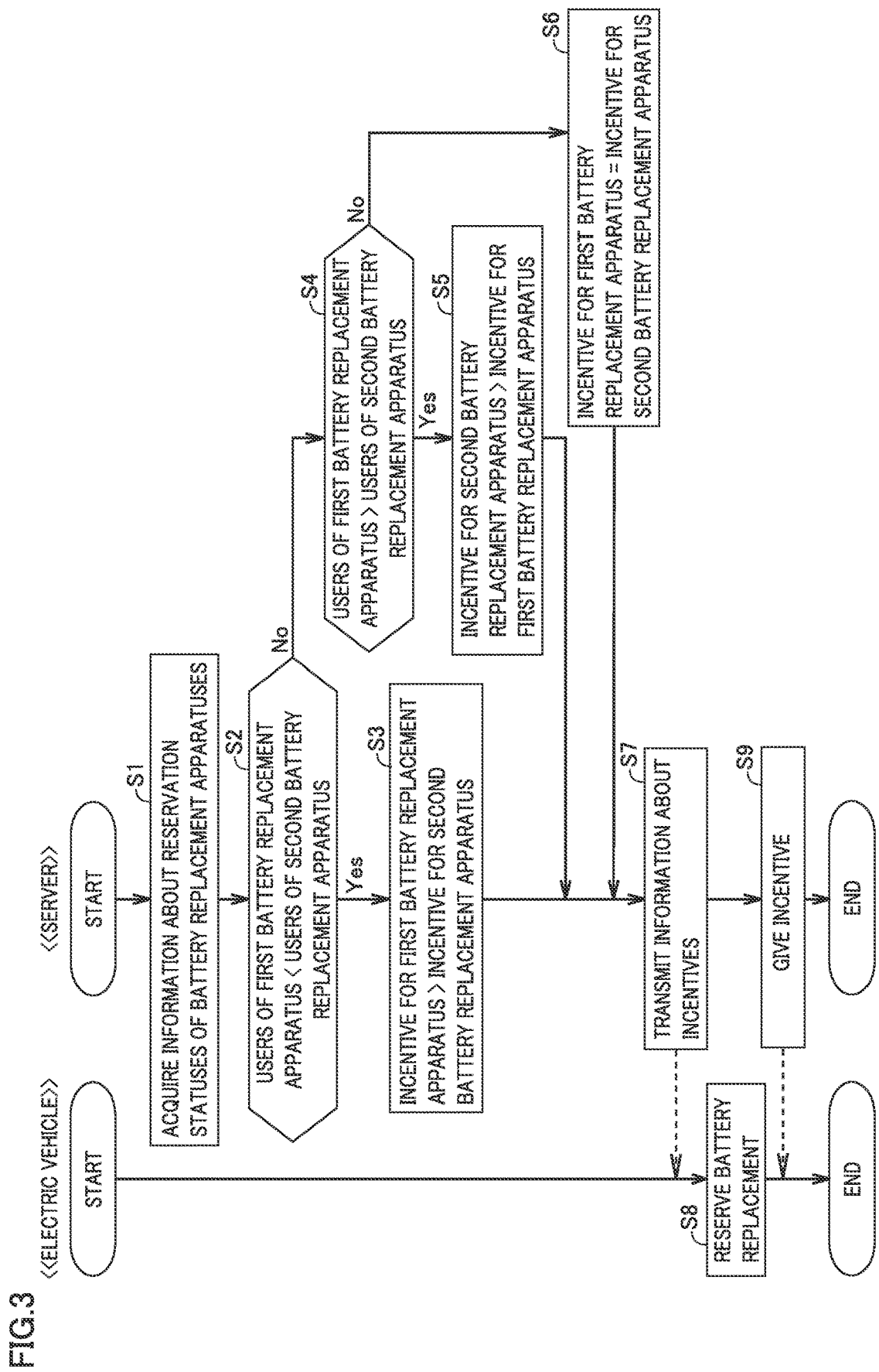
FIG. 3 is a sequence diagram of the system according to the first embodiment.

Referring now to FIG. 3, sequence control between server 100 and electric vehicle 10 is described.

In step S1, server 100 (communication unit 103) acquires information about a reservation status of each of first battery replacement apparatus 20A and second battery replacement apparatus 20B. Note that the process of step S1 may be performed based on a provisional reservation for battery replacement apparatus 20 being made by the user of electric vehicle 10. The provisional reservation may include information about a time period in which battery replacement apparatus 20 is to be used.

In step S2, server 100 (processor 101) determines whether or not the number of users of first battery replacement apparatus 20A is smaller than the number of users of second battery replacement apparatus 20B. When the determination is Yes in step S2, the process proceeds to step S3. When the determination is No in step S2, the process proceeds to step S4. Note that, in step S2, the numbers of users of battery replacement apparatuses 20 in the time period specified in the provisional reservation by the user of electric vehicle 10 may be compared to each other.

In step S3, server 100 (processor 101) performs control of making the incentive for first battery replacement apparatus 20A larger than the incentive for second battery replacement apparatus 20B. In this case, the incentive corresponding to second battery replacement apparatus 20B may not be set.

In step S4, server 100 (processor 101) determines whether or not the number of users of first battery replacement apparatus 20A is larger than the number of users of second battery replacement apparatus 20B. When the determination is Yes in step S4, the process proceeds to step S5. When the determination is No in step S4 (that is, when the number of users of first battery replacement apparatus 20A is equal to the number of users of second battery replacement apparatus 20B), the process proceeds to step S6.

In step S5, server 100 (processor 101) performs control of making the incentive for second battery replacement apparatus 20B larger than the incentive for first battery replacement apparatus 20A. In this case, the incentive corresponding to first battery replacement apparatus 20A may not be set.

In step S6, server 100 (processor 101) performs control of making the incentive for first battery replacement apparatus 20A equal to the incentive for second battery replacement apparatus 20B. In this case, the incentive corresponding to each of first battery replacement apparatus 20A and second battery replacement apparatus 20B may not be set.

In step S7, server 100 (communication unit 103) transmits information about the incentives that was set in step S3, S5 or S6 to the user of electric vehicle 10.

In step S8, the user of electric vehicle 10 makes a reservation for first battery replacement apparatus 20A or second battery replacement apparatus 20B.

In step S9, server 100 (processor 101) performs control of giving the incentive corresponding to battery replacement apparatus 20 that was reserved in step S8 to the user of electric vehicle 10.

As described above, in the first embodiment, processor 101 adjusts, based on the information about the reservation status of battery replacement apparatus 20, the incentive given to the user of battery replacement apparatus 20. Accordingly, the number of users of first battery replacement apparatus 20A and the number of users of second battery replacement apparatus 20B can be readily equalized by the adjustment of the incentives based on the reservation statuses at first battery replacement apparatus 20A and second battery replacement apparatus 20B.

Second Embodiment

Figure 4:
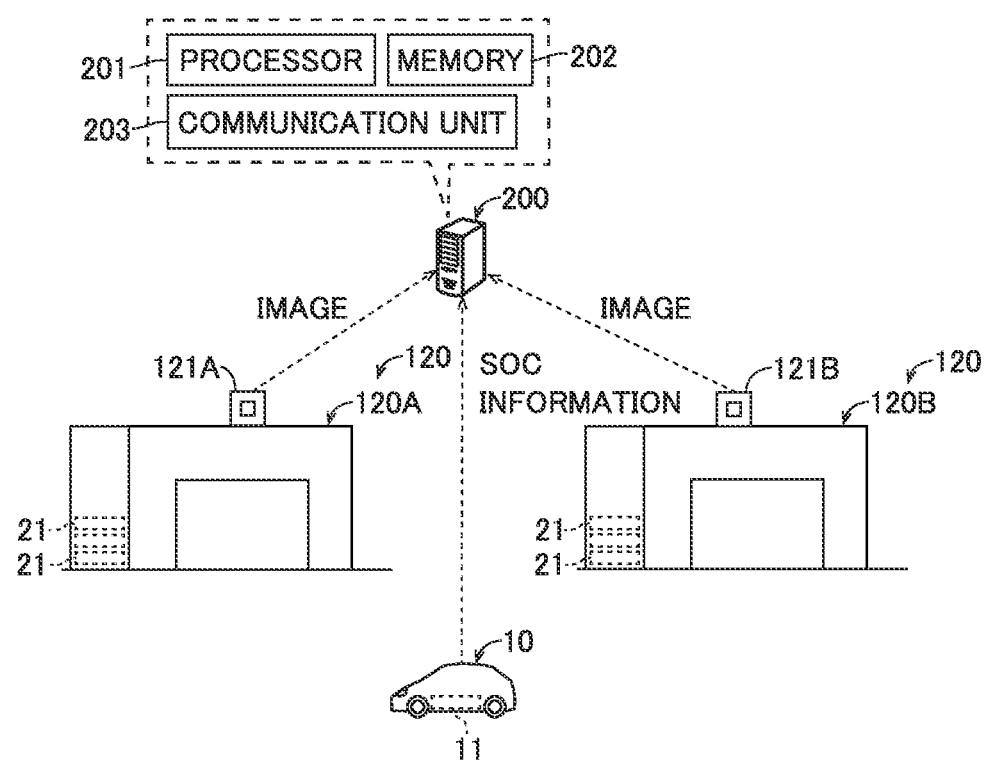
FIG. 4 shows a configuration of a system according to a second embodiment.
Figure 5:
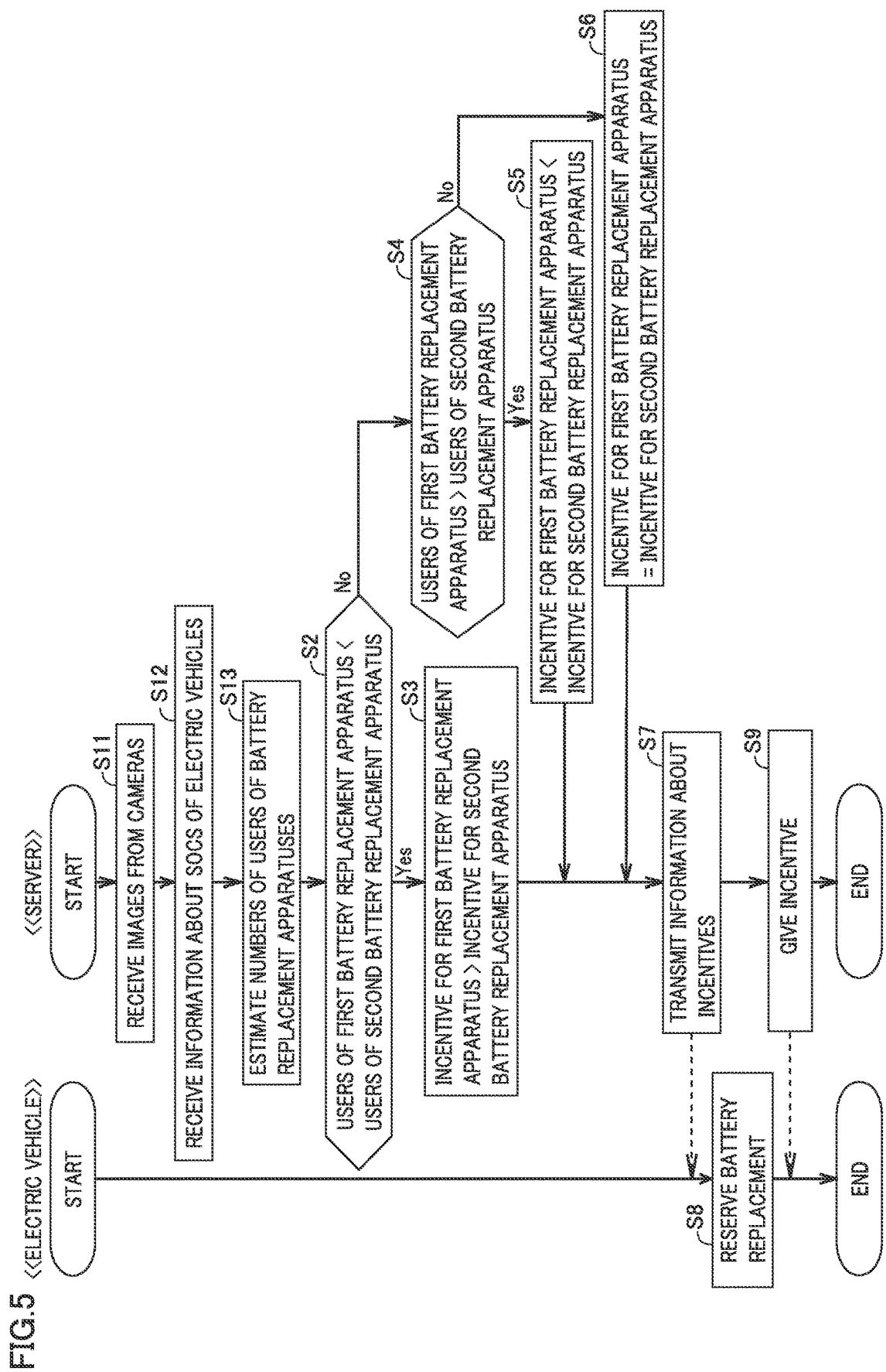
FIG. 5 is a sequence diagram of the system according to the second embodiment.

Referring now to FIGS. 4 and 5, a second embodiment of the present disclosure is described. In the second embodiment, the same components as those of the first embodiment are denoted by the same reference characters and description thereof will not be repeated.

FIG. 4 shows a configuration of a system 2 according to the second embodiment. System 2 includes a server 200, a plurality of battery replacement apparatuses 120, and electric vehicle 10. Note that server 200 and system 2 are one example of "battery replacement control device" and one example of "battery replacement control system" of the present disclosure, respectively.

The plurality of battery replacement apparatuses 120 include a first battery replacement apparatus 120A and a second battery replacement apparatus 120B. First battery replacement apparatus 120A and second battery replacement apparatus 120B have the same configuration. Note that the plurality of battery replacement apparatuses 120 may include three or more battery replacement apparatuses 120.

First battery replacement apparatus 120A is provided with a camera 121A. Second battery replacement apparatus 120B is provided with a camera 121B. Camera 121A acquires an image around first battery replacement apparatus 120A. Camera 121B acquires an image around second battery replacement apparatus 120B. Note that camera 121A (121B) may be provided separately from and in the vicinity of first battery replacement apparatus 120A (120B).

Server 200 includes a processor 201, a memory 202, and a communication unit 203. Note that processor 201 and communication unit 203 are one example of "control unit" and one example of "acquisition unit" of the present disclosure, respectively.

Communication unit 203 of server 200 communicates with each of the plurality of battery replacement apparatuses 120 and electric vehicle 10. Communication unit 203 includes various types of communication I/Fs. Communication unit 203 communicates with each of camera 121A and camera 121B. Each of camera 121A and camera 121B transmits an image it captured to communication unit 203 of server 200.

Communication unit 203 of server 200 receives information about a state of charge (SOC) of electric vehicle 10 managed by server 200. Specifically, electric vehicle 10 transmits information about its own SOC to communication unit 203.

Here, server 200 (processor 201) predicts users of battery replacement apparatus 120 based on the number of electric vehicles 10 around battery replacement apparatus 120. Specifically, processor 201 predicts users of first battery replacement apparatus 120A based on the number of electric vehicles 10 shown in the image from camera 121A. Processor 201 also predicts users of second battery replacement apparatus 120B based on the number of electric vehicles 10 shown in the image from camera 121B. More specifically, processor 201 predicts the users based on the number of electric vehicles 10 having an SOC smaller than or equal to a predetermined value (30%, for example) among electric vehicles 10 around first battery replacement apparatus 120A (second battery replacement apparatus 120B).

Note that processor 201 may predict the users of battery replacement apparatus 120 by techniques other than the camera. For example, processor 201 may detect the number of electric vehicles 10 around battery replacement apparatus 120 based on information from global positioning systems (GPSs) mounted on electric vehicles 10. Note that the image from each of cameras 121A and 121B is one example of "situation information" and "number-of-users information" of the present disclosure.

Processor 201 may also make the above predictions using a learned model generated by a machine learning technique such as deep learning.

(Sequence Control)

Referring now to FIG. 5, sequence control between server 200 and electric vehicle 10 is described.

In step S11, server 200 (communication unit 203) receives an image from each of cameras 121A and 121B. Note that the process of step S11 may be performed based on a provisional reservation for battery replacement apparatus 120 being made by the user of electric vehicle 10.

In step S12, server 200 (communication unit 203) acquires information about the SOC of each of the plurality of electric vehicles 10 managed by server 200. Server 200 (communication unit 203) may also identify, based on a vehicle number or the like, electric vehicle 10 shown in the image that was acquired in step S11, and acquire information about the SOC of identified electric vehicle 10.

In step S13, server 200 (processor 201) estimates, based on the image that was acquired in step S11 and the SOC information that was acquired in step S12, the number of users of each of first battery replacement apparatus 120A and second battery replacement apparatus 120B. The process then proceeds to step S2 in the first embodiment. Note that the number of users may be estimated based on information indicating a degree of deterioration of battery 11, instead of based on the SOC information.

Third Embodiment

Figure 6:
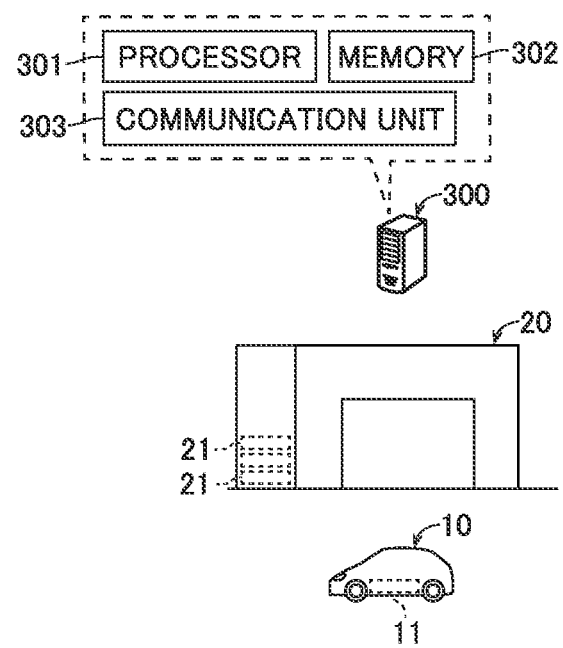
FIG. 6 shows a configuration of a system according to a third embodiment.
Figure 7:
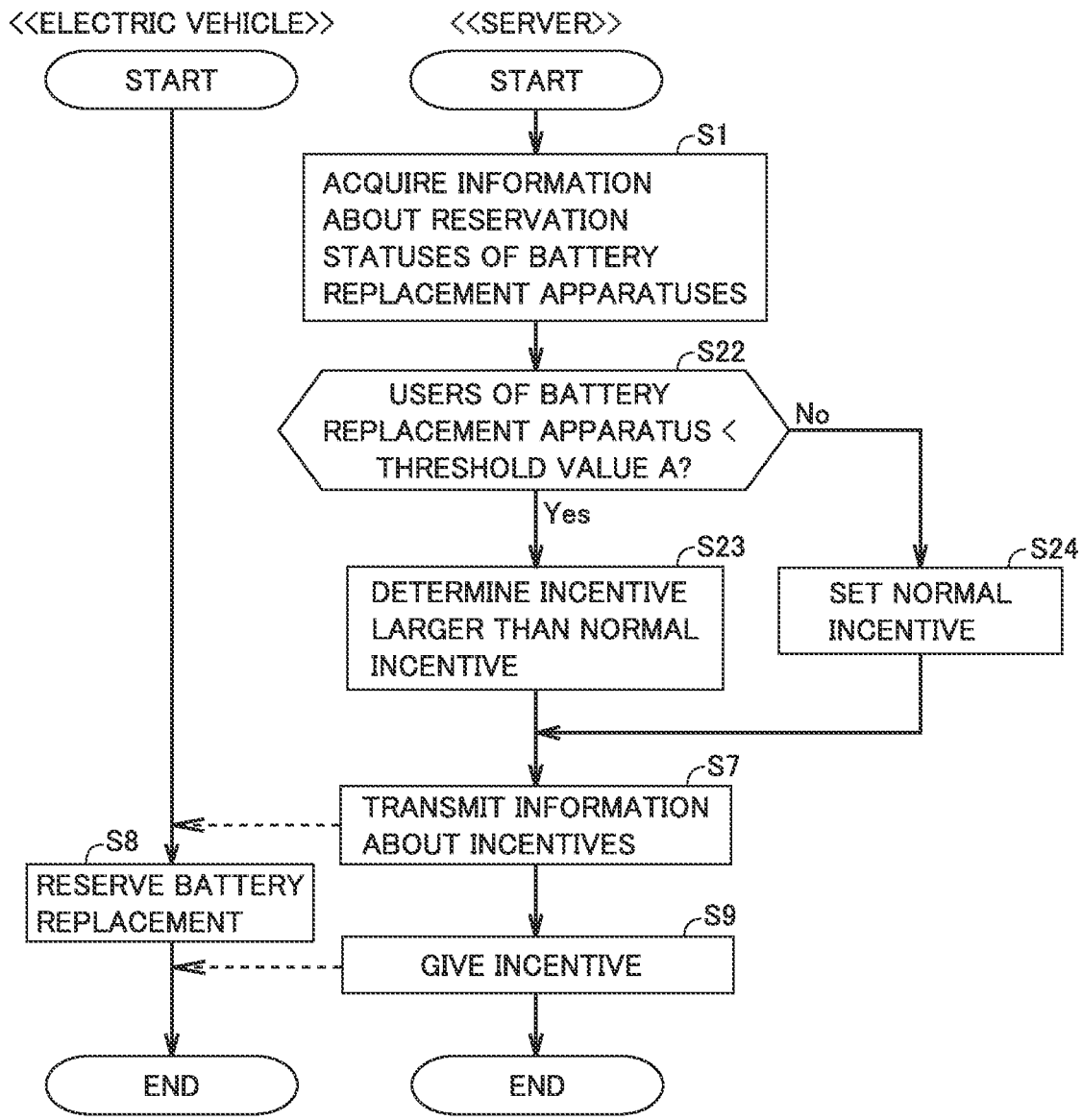
FIG. 7 is a sequence diagram of the system according to the third embodiment.

Referring now to FIGS. 6 and 7, a third embodiment of the present disclosure is described. In the third embodiment, the same components as those of the first embodiment are denoted by the same reference characters and description thereof will not be repeated.

FIG. 6 shows a configuration of a system 3 according to the third embodiment. System 3 includes a server 300, battery replacement apparatus 20, and electric vehicle 10. Note that server 300 and system 3 are one example of "battery replacement control device" and one example of "battery replacement control system" of the present disclosure, respectively.

Server 300 includes a processor 301, a memory 302, and a communication unit 303. Note that processor 301 and communication unit 303 are one example of "control unit" and one example of "acquisition unit" of the present disclosure, respectively.

(Sequence Control)

Referring now to FIG. 7, sequence control between server 300 and electric vehicle 10 is described.

In step S22 following step S1, server 300 (processor 301) determines whether or not the number of users of battery replacement apparatus 20 is smaller than a predetermined threshold value A. For example, the number of users (the number of people who made a reservation) of battery replacement apparatus 20 in a time period specified in a provisional reservation by the user of electric vehicle 10 may be compared to threshold value A. When the number of users is smaller than threshold value A (Yes in S22), the process proceeds to step S23. When the number of users is larger than or equal to threshold value A (No in S22), the process proceeds to step S24. Note that threshold value A is one example of "first threshold value" of the present disclosure.

In step S23, server 300 (processor 301) performs control of making the incentive for using battery replacement apparatus 20 larger than the incentive at the normal time (incentive in S24). Note that the incentive may not be given at the normal time. The process then proceeds to step S7.

In step S24, server 300 (processor 301) performs control of setting the incentive for using battery replacement apparatus 20 to the incentive at the normal time. The process then proceeds to step S7.

Although the number of users of battery replacement apparatus 20 is compared to a single threshold value (A) in the example of FIG. 7, this is not restrictive. For example, control may be performed such that, by providing a plurality of threshold values, the incentive given increases gradually (in a stepwise manner) as the number of users decreases.

Fourth Embodiment

Figures 8, 9:
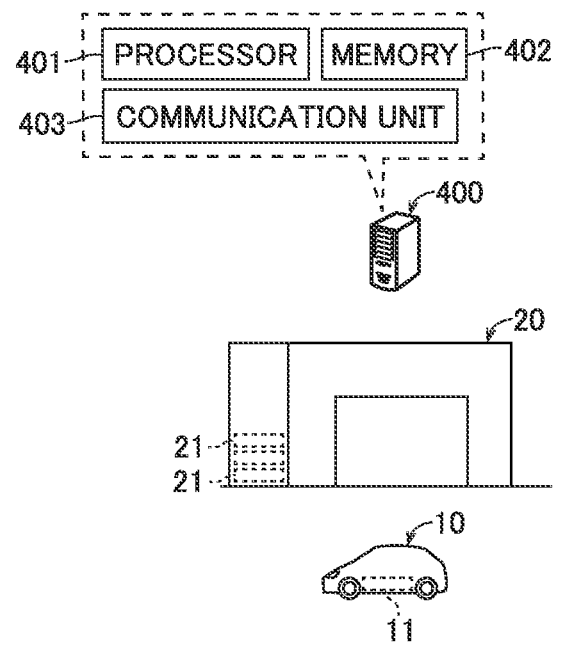
FIG. 8 shows a configuration of a system according to a fourth embodiment.
FIG. 9 shows a relationship between a time period and the number of users in a battery replacement apparatus.
Figure 10:
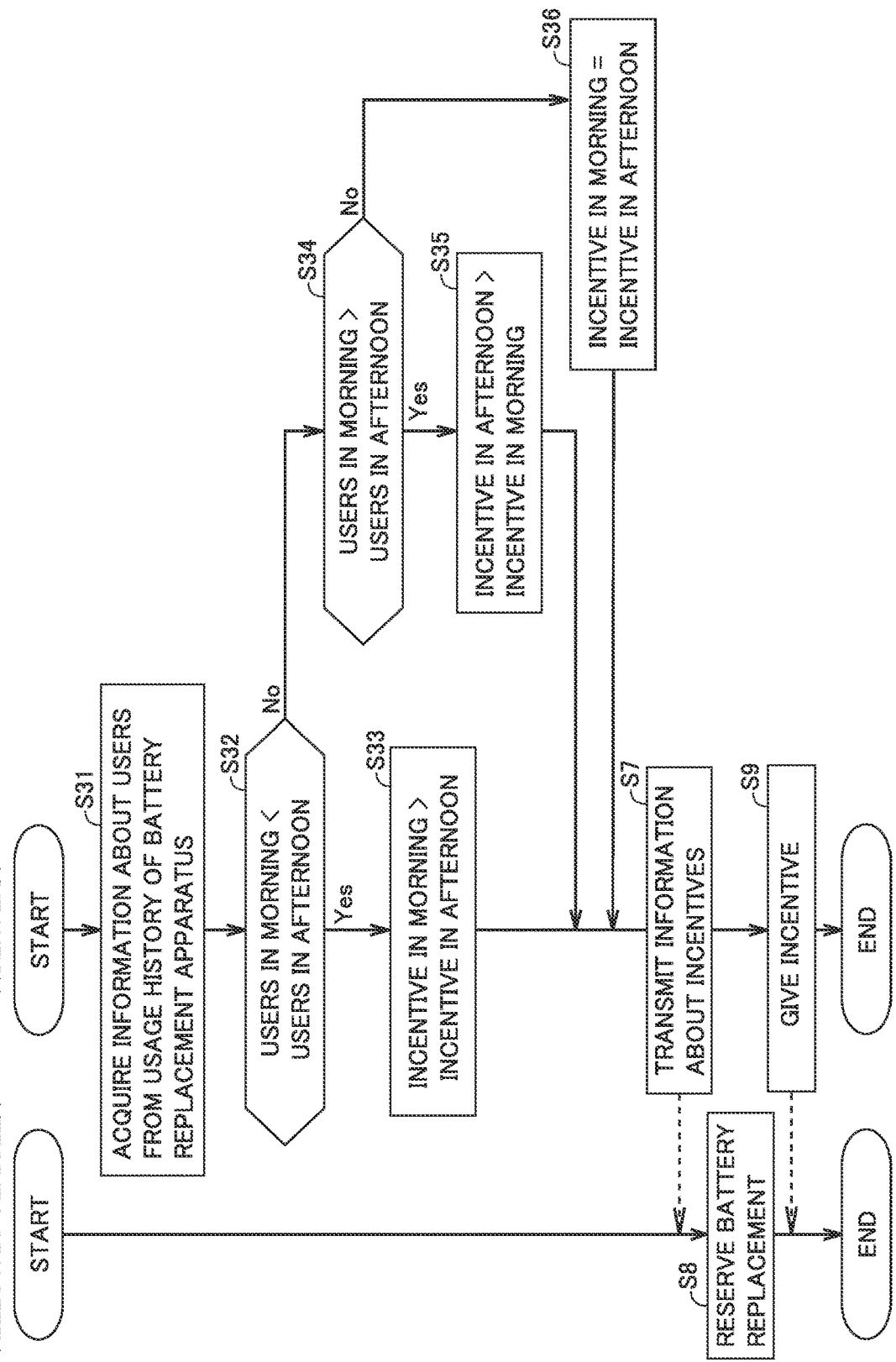
FIG. 10 is a sequence diagram of the system according to the fourth embodiment.

Referring now to FIGS. 8 to 10, a fourth embodiment of the present disclosure is described. In the fourth embodiment, the same components as those of the first embodiment are denoted by the same reference characters and description thereof will not be repeated.

FIG. 8 shows a configuration of a system 4 according to the fourth embodiment. System 4 includes a server 400, battery replacement apparatus 20, and electric vehicle 10. Note that server 400 and system 4 are one example of "battery replacement control device" and one example of "battery replacement control system" of the present disclosure, respectively.

Server 400 includes a processor 401, a memory 402, and a communication unit 403. Note that processor 401 and communication unit 403 are one example of "control unit" and one example of "acquisition unit" of the present disclosure, respectively.

Memory 402 stores information about a usage history of battery replacement apparatus 20 for each time period during a predetermined period in the past (see FIG. 9). As shown in FIG. 9, for example, memory 402 stores information about an average value of the number of users of battery replacement apparatus 20 in each of the morning and the afternoon of the past week. Note that the information about the average value is updated every day by processor 401. Note that the morning and the afternoon are one example of "first time period" and one example of "second time period" of the present disclosure, respectively.

(Sequence Control)

Referring now to FIG. 10, sequence control between server 400 and electric vehicle 10 is described.

In step S31, server 400 (processor 401) acquires, from a usage history of battery replacement apparatus 20 stored in memory 402, information about the number of users of battery replacement apparatus 20 in each of the morning and the afternoon of the past week. Note that the process of step S31 may be performed based on a provisional reservation for battery replacement apparatus 20 being made by the user of electric vehicle 10. The provisional reservation may include information about a time period in which battery replacement apparatus 20 is to be used by the user.

In step S32, server 400 (processor 401) determines whether or not the number of users of battery replacement apparatus 20 in the morning is smaller than the number of users of battery replacement apparatus 20 in the afternoon. When the determination is Yes in step S32, the process proceeds to step S33. When the determination is No in step S32, the process proceeds to step S34.

In step S33, server 400 (processor 401) performs control of making the incentive corresponding to the morning larger than the incentive corresponding to the afternoon. In this case, the incentive corresponding to the afternoon may not be set. The process then proceeds to step S7.

In step S34, server 400 (processor 401) determines whether or not the number of users of battery replacement apparatus 20 in the morning is larger than the number of users of battery replacement apparatus 20 in the afternoon. When the determination is Yes in step S34, the process proceeds to step S35. When the determination is No in step S34 (that is, when the number of users of battery replacement apparatus 20 in the morning is equal to the number of users of battery replacement apparatus 20 in the afternoon), the process proceeds to step S36.

In step S35, server 400 (processor 401) performs control of making the incentive corresponding to the afternoon larger than the incentive corresponding to the morning. In this case, the incentive corresponding to the morning may not be set. The process then proceeds to step S7.

In step S36, server 400 (processor 401) performs control of making the incentive corresponding to the morning equal to the incentive corresponding to the afternoon. In this case, both the incentive corresponding to the morning and the incentive corresponding to the afternoon may not be set. The process then proceeds to step S7.

Note that the incentive may be adjusted based on, for example, an hourly average value of the number of users of battery replacement apparatus 20. In this case, control may be performed such that the incentive sequentially increases from a time period having a small average value.

Fifth Embodiment

Figure 11:
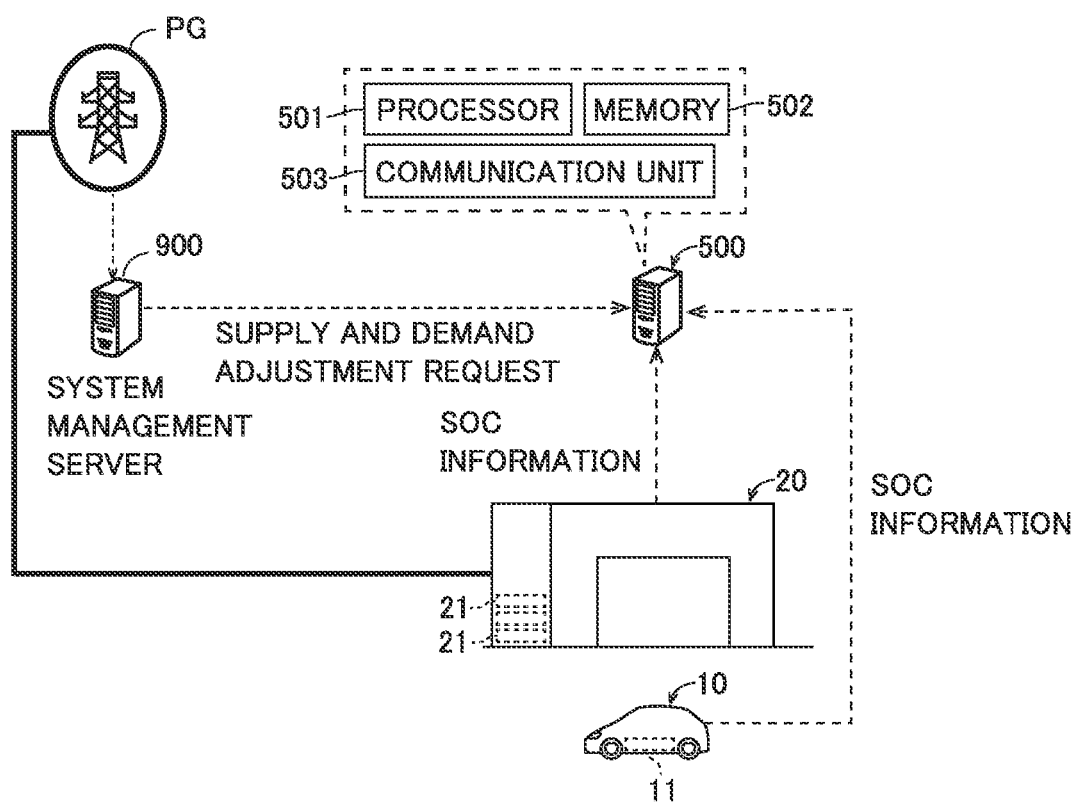
FIG. 11 shows a configuration of a system according to a fifth embodiment.
Figure 12:
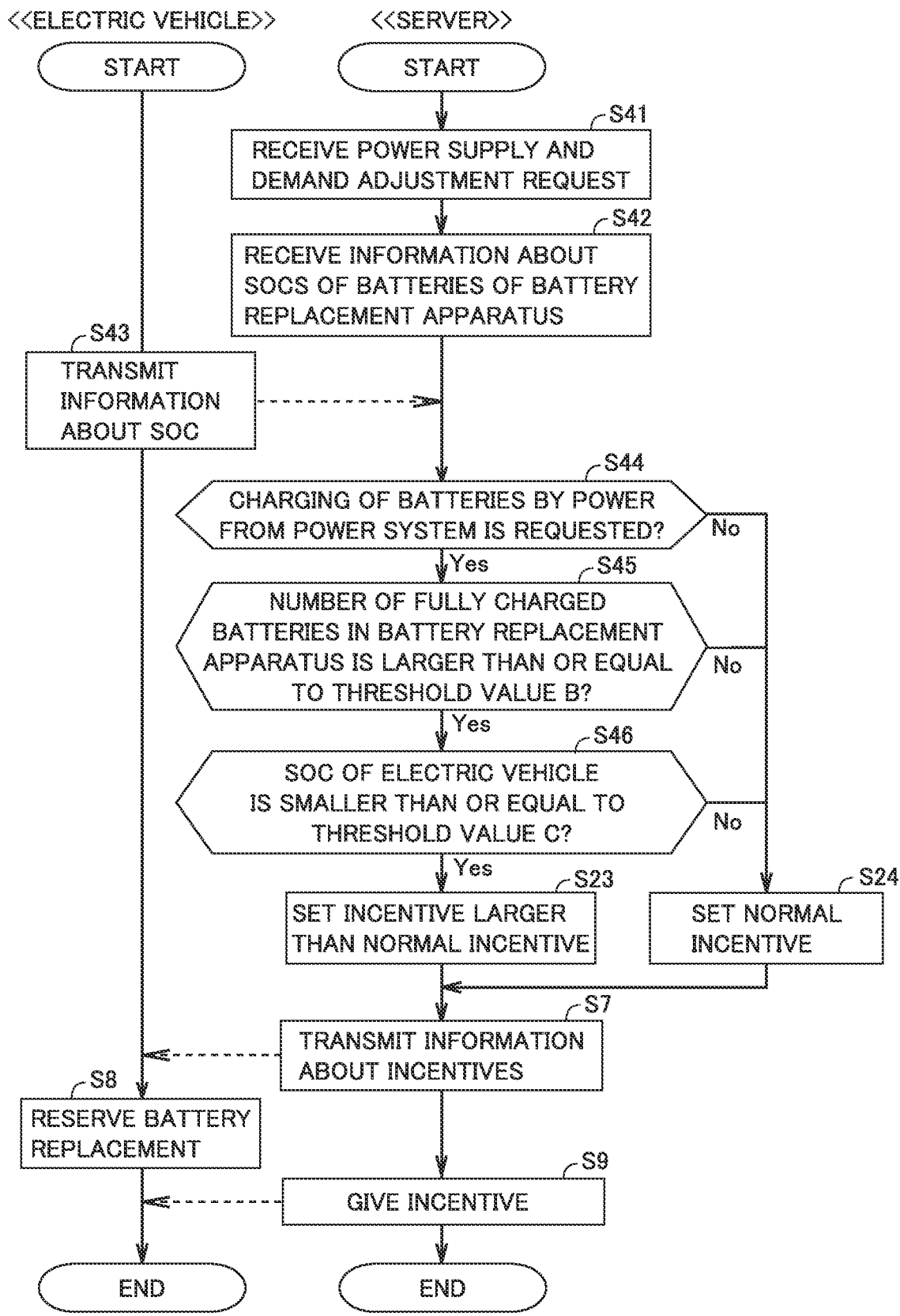
FIG. 12 is a sequence diagram of the system according to the fifth embodiment.

Referring now to FIGS. 11 and 12, a fifth embodiment of the present disclosure is described. In the fifth embodiment, the same components as those of the first embodiment are denoted by the same reference characters and description thereof will not be repeated.

FIG. 11 shows a configuration of a system 5 according to the fifth embodiment. System 5 includes a server 500, battery replacement apparatus 20, electric vehicle 10, a system management server 900, and a power system PG. Note that server 500 and system 5 are one example of "battery replacement control device" and one example of "battery replacement control system" of the present disclosure, respectively.

Power system PG is a power grid formed by a power plant and a power transmission and distribution facility which are not shown. In this embodiment, an electric power company serves as a power generation business operator and a power transmission and distribution business operator. The electric power company corresponds to a general power transmission and distribution business operator, and performs maintenance and management of power system PG. The electric power company corresponds to a manager of power system PG.

System management server 900 manages power supply and demand in power system PG (power grid). System management server 900 also belongs to the electric power company. System management server 900 transmits, based on generated power and consumed power by each power adjustment resource managed by system management server 900, a request to adjust an amount of power demand by power system PG (supply and demand adjustment request) to server 500. Specifically, system management server 900 transmits to server 500, when the generated power or consumed power by the power adjustment resource is expected to become larger than the generated power or consumed power at the normal time (or is currently large), a request to increase or decrease the amount of power demand, relative to the amount of power demand at the normal time, respectively.

Server 500 is a server managed by an aggregator. The aggregator refers to an electric power supplier that oversees a plurality of power adjustment resources, such as regions and predetermined facilities, and provides energy management service.

As one technique for increasing or decreasing the amount of power demand by power system PG, server 500 performs power supply to power system PG (external power supply) and charging from power system PG (external charging), using batteries 21 in battery replacement apparatus 20.

Server 500 includes a processor 501, a memory 502, and a communication unit 503. Note that processor 501 and communication unit 503 are one example of "control unit" and one example of "acquisition unit" of the present disclosure, respectively.

Communication unit 503 of server 500 receives, from system management server 900, information about the request to adjust power supply and demand in power system PG. Communication unit 503 of server 500 also receives, by communicating with electric vehicle 10, information about the SOC of electric vehicle 10. Communication unit 503 of server 500 also receives, by communicating with battery replacement apparatus 20, information about the SOC of each of the plurality of batteries 21.

(Sequence Control)

Referring now to FIG. 12, sequence control between server 500 and electric vehicle 10 is described.

In step S41, server 500 (communication unit 503) receives, from system management server 900, a request to adjust power supply and demand.

In step S42, server 500 (communication unit 503) receives information about the SOC of each of the plurality of batteries 21 of battery replacement apparatus 20.

In step S43, electric vehicle 10 transmits information about the SOC of electric vehicle 10 to server 500 (communication unit 503). Note that the process of step S43 may be performed before steps S41 and S42.

In step S44, server 500 (processor 501) determines whether or not the request in step S41 is a request to charge batteries 21 by the power from power system PG. When the determination is Yes in step S44, the process proceeds to step S45. When the determination is No in step S44, the process proceeds to step S24 described above in the third embodiment.

In step S45, server 500 (processor 501) determines whether or not the number of fully charged batteries 21 in battery replacement apparatus 20 is larger than or equal to a predetermined threshold value B (ten, for example). When the number of batteries 21 is larger than or equal to threshold value B (Yes in S45), the process proceeds to step S46. When the number of batteries 21 is smaller than threshold value B (No in S45), the process proceeds to step S24. Note that threshold value B is one example of "second threshold value" of the present disclosure.

Note that battery 21 in battery replacement apparatus 20 is charged to a value (about 80%, for example) close to 100% once it is stored in battery replacement apparatus 20. Then, battery 21 is charged to have an SOC of 100% when a reservation is made to use the battery replacement apparatus. Thus, "fully charged battery 21" also includes battery 21 that has been charged to have an SOC of about 80%.

In step S46, server 500 (processor 501) determines, based on the information that was acquired in step S43, whether or not the SOC of electric vehicle 10 is smaller than or equal to a predetermined threshold value C (20%, for example). When the SOC is smaller than or equal to threshold value C (Yes in S46), the process proceeds to step S23. When the SOC is larger than threshold value C (No in S46), the process proceeds to step S24. Note that threshold value C is one example of "third threshold value" of the present disclosure.

Although the SOC of electric vehicle 10 is compared to a single threshold value (C) in the example of FIG. 12, this is not restrictive. For example, control may be performed such that, by providing a plurality of threshold values, the incentive given increases gradually (in a stepwise manner) as the SOC decreases.

Sixth Embodiment

Figure 13:
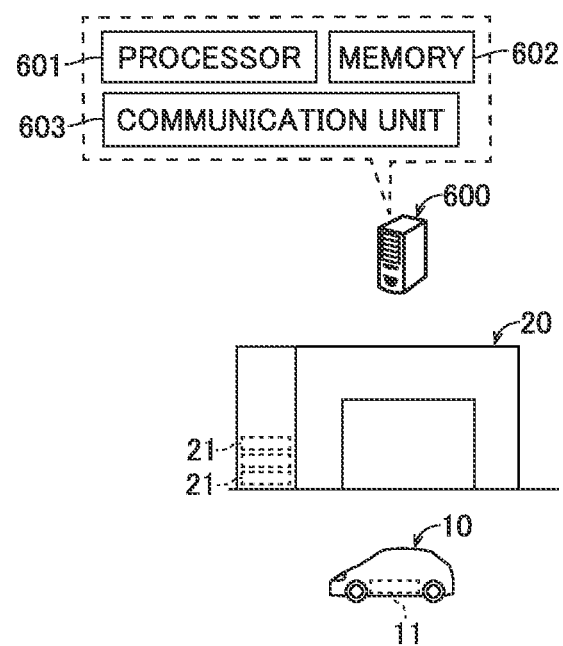
FIG. 13 shows a configuration of a system according to a sixth embodiment.
Figure 14:
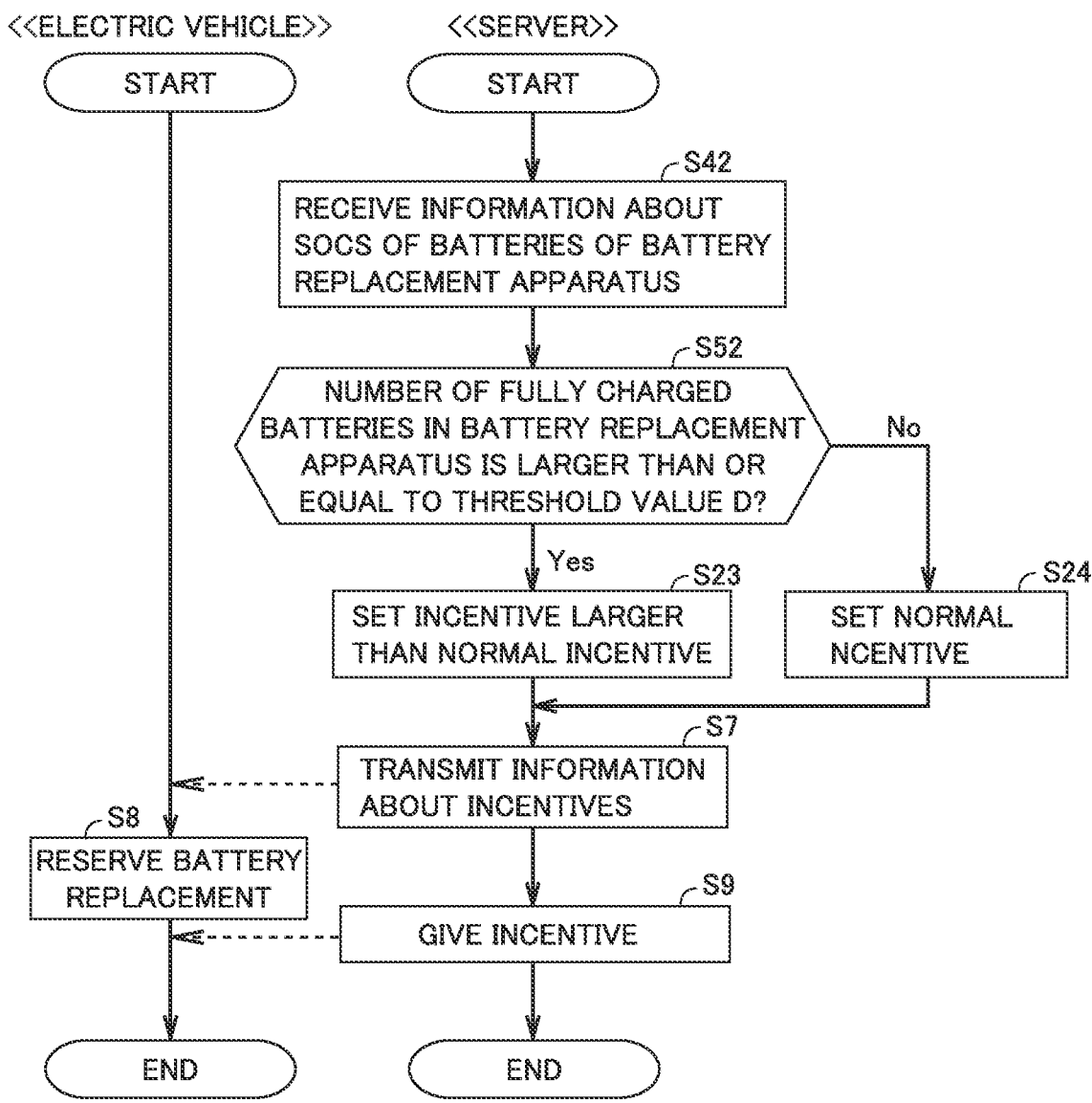
FIG. 14 is a sequence diagram of the system according to the sixth embodiment.

Referring now to FIGS. 13 and 14, a sixth embodiment of the present disclosure is described. In the sixth embodiment, the same components as those of the first embodiment are denoted by the same reference characters and description thereof will not be repeated.

FIG. 13 shows a configuration of a system 6 according to the sixth embodiment. System 6 includes a server 600, battery replacement apparatus 20, and electric vehicle 10. Note that server 600 and system 6 are one example of "battery replacement control device" and one example of "battery replacement control system" of the present disclosure, respectively.

Server 600 includes a processor 601, a memory 602, and a communication unit 603. Note that processor 601 and communication unit 603 are one example of "control unit" and one example of "acquisition unit" of the present disclosure, respectively.

Communication unit 603 of server 600 receives, by communicating with battery replacement apparatus 20, information about the SOC of each of the plurality of batteries 21.
(Sequence Control)

Referring now to FIG. 14, sequence control between server 500 and electric vehicle 10 is described.

After the process of step S42 described above in the fifth embodiment has been performed, the process proceeds to step S52. In step S52, server 600 (processor 601) determines whether or not the number of fully charged batteries 21 in battery replacement apparatus 20 is larger than or equal to a predetermined threshold value D (ten, for example). When the number of batteries 21 is larger than or equal to threshold value D (Yes in step S52), the process proceeds to step S23. When the number of batteries 21 is smaller than threshold value D (No in step S52), the process proceeds to step S24.

Although the number of fully charged batteries 21 is compared to a single threshold value (D) in the example of FIG. 14, this is not restrictive. For example, control may be performed such that, by providing a plurality of threshold values, the incentive given increases gradually (in a stepwise manner) as the number increases.

Seventh Embodiment

Figure 15:
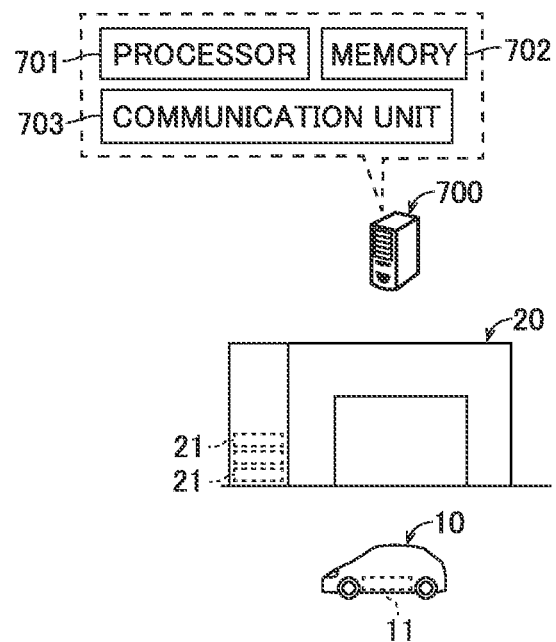
FIG. 15 shows a configuration of a system according to a seventh embodiment.
Figure 16:
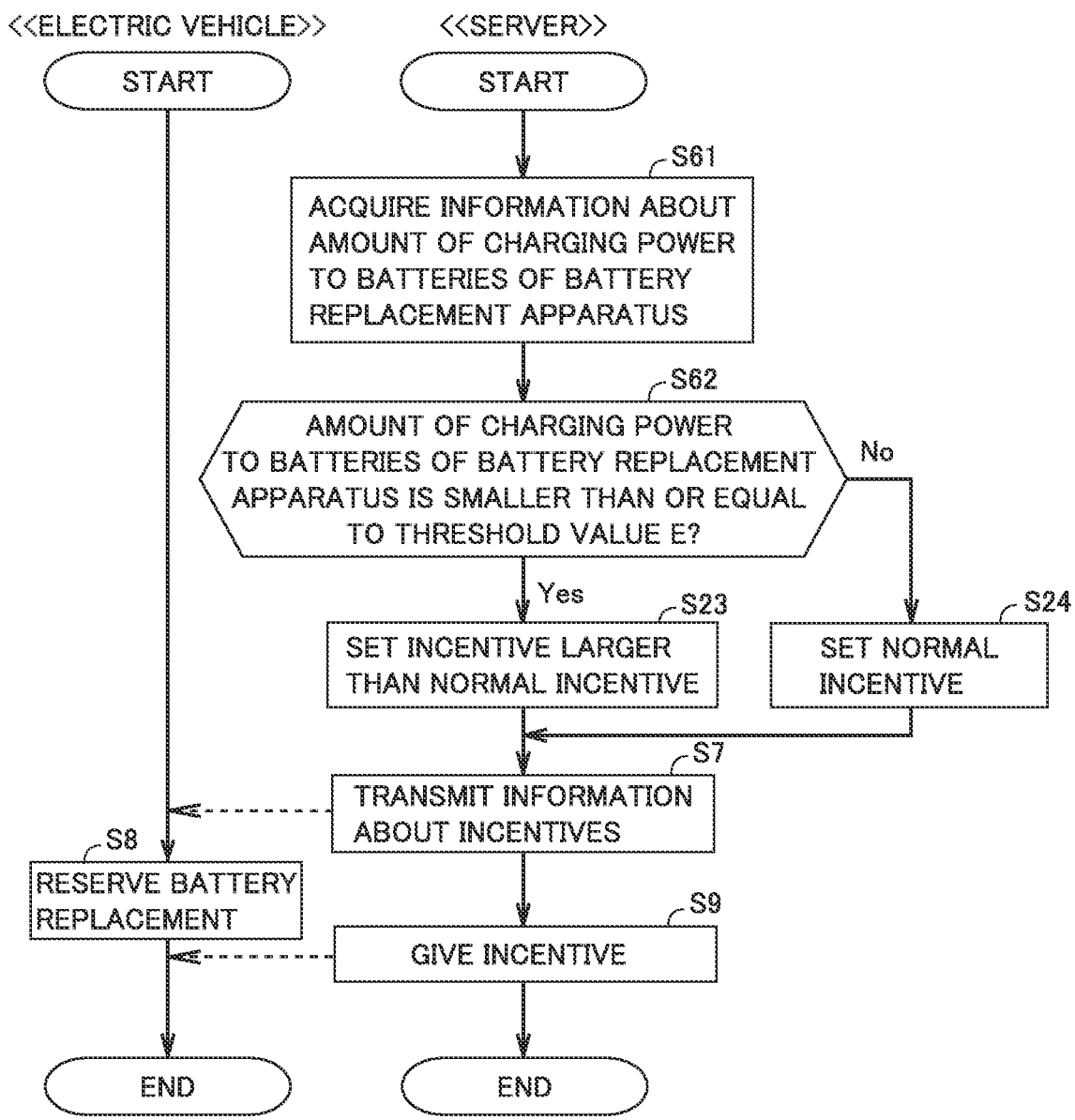
FIG. 16 is a sequence diagram of the system according to the seventh embodiment.

Referring now to FIGS. 15 and 16, a seventh embodiment of the present disclosure is described. In the seventh embodiment, the same components as those of the first embodiment are denoted by the same reference characters and description thereof will not be repeated.

FIG. 15 shows a configuration of a system 7 according to the seventh embodiment. System 7 includes a server 700, battery replacement apparatus 20, and electric vehicle 10. Note that server 700 and system 7 are one example of "battery replacement control device" and one example of "battery replacement control system" of the present disclosure, respectively.

Server 700 includes a processor 701, a memory 702, and a communication unit 703. Note that processor 701 and communication unit 703 are one example of "control unit" and one example of "acquisition unit" of the present disclosure, respectively.

Communication unit 703 of server 700 receives, by communicating with battery replacement apparatus 20, information about an amount of charging power for batteries 21 in battery replacement apparatus 20.
(Sequence Control)

Referring now to FIG. 16, sequence control between server 700 and electric vehicle 10 is described.

In step S61, server 700 (communication unit 703) acquires information about an amount of charging power to batteries 21 of battery replacement apparatus 20. Note that the process of step S61 may be performed based on a provisional reservation for battery replacement apparatus 20 being made by the user of electric vehicle 10. Note that the amount of charging power may include, for example, currently used power (kW), an amount of used power (kWh) during a predetermined period (one hour) in the past, or the like.

In step S62, server 700 (processor 701) determines whether or not the amount of charging power that was acquired in step S61 is smaller than or equal to a predetermined threshold value E (100 kW, for example). When the amount of charging power is smaller than or equal to threshold value E (Yes in step S62), the process proceeds to step S23. When the amount of charging power is larger than threshold value E (No in step S62), the process proceeds to step S24.

Although the amount of charging power to batteries 21 is compared to a single threshold value (E) in the example of FIG. 16, this is not restrictive. For example, control may be performed such that, by providing a plurality of threshold values, the incentive given increases gradually (in a stepwise manner) as the amount of charging power decreases.

Although the incentive is adjusted by the server (100 to 700) provided separately from battery replacement apparatus 20 (120) in the examples of the first to seventh embodiments, the present disclosure is not limited to these examples. For example, a control device provided in the battery replacement apparatus may adjust the incentive.

The controls and configurations described in the first to seventh embodiments may be combined as appropriate.

Although embodiments of the present disclosure have been described, it should be understood that the embodiments disclosed herein are illustrative and non-restrictive in every respect. The scope of the present disclosure is defined by the terms of the claims and is intended to include any modifications within the scope and meaning equivalent to the terms of the claims.

What is claimed is:

1. A battery replacement control system comprising:
an electric vehicle; and
a battery replacement control device that manages at least one battery replacement apparatus including at least one battery interchangeable with a battery mounted on the electric vehicle, the battery mounted on the electric vehicle being a first battery and the at least one battery being a second battery, the battery replacement control device comprising:
a communication unit that acquires situation information about a situation in the battery replacement apparatus; and
a processor that adjusts, based on the situation information, an incentive given to a user of the battery replacement apparatus, wherein:
the electric vehicle is configured to acquire information including an SOC of the electric vehicle, and transmit the information about the SOC of the electric vehicle to the processor,
the situation information includes information that the battery replacement apparatus is required to charge the second battery using power from a power system, and information about an SOC of the second battery,
the processor determines a number of the second batteries having a full SOC is larger than or equal to a predetermined first threshold value,
the processor makes, in response to determining the number of the second batteries having a full SOC is larger than or equal to a predetermined first threshold value, the incentive when the SOC of the electric vehicle is smaller than or equal to a predetermined second threshold value larger than the incentive when the SOC of the electric vehicle is larger than the predetermined second threshold value, and the processor gradually adjusts the incentive in a stepwise manner as the SOC of the electric vehicle decreases.

2. The battery replacement control system according to claim 1, wherein the situation information includes number-of-users information about a number of the users.

3. The battery replacement control system according to claim 2, wherein the number-of-users information includes information about a reservation status of use of the battery replacement apparatus.

4. The battery replacement control system according to claim 2, wherein the number-of-users information includes information about a number of the electric vehicles around the battery replacement apparatus.

5. The battery replacement control device according to claim 2, wherein the at least one battery replacement apparatus includes a first battery replacement apparatus and a second battery replacement apparatus, the communication unit acquires the number-of-users information for each of the first battery replacement apparatus and the second battery replacement apparatus, and the processor makes the incentive corresponding to one of the first battery replacement apparatus and the second battery replacement apparatus having a smaller number of the users larger than the incentive corresponding to the other of the first battery replacement apparatus and the second battery replacement apparatus having a larger number of the users.

6. The battery replacement control system according to claim 2, wherein the processor makes the incentive when the number of the users is smaller than or equal to a predetermined third threshold value larger than the incentive when the number of the users is larger than the predetermined third threshold value.

7. The battery replacement control system according to claim 6, wherein the situation information includes information about the SOC of the second battery, the processor determines a number of the second batteries having the full SOC is larger than or equal to a predetermined fourth threshold value, and the processor makes, in response to determining the number of the second batteries having the full SOC is larger than or equal to a predetermined fourth threshold value, the incentive when the number of the second batteries having the full SOC is larger than or equal to the predetermined fourth threshold value larger than the incentive when the number of the second batteries having the full SOC is smaller than the predetermined fourth threshold value.

8. The battery replacement control system according to claim 7, wherein the situation information includes information about an amount of power being used to charge the second battery, the processor determines the amount of power is smaller than or equal to a predetermined fifth threshold value, and the processor makes, in response to determining the amount of power is smaller than or equal to the predetermined fifth threshold value, the incentive when the amount of power is smaller than or equal to the predetermined fifth threshold value larger than the incentive when the amount of power is larger than the predetermined fifth threshold value.

9. The battery replacement control system according to claim 2, wherein the number-of-users information includes a history of the number of the users in a first time period, and a history of the number of the users in a second time period, and the processor makes the incentive corresponding to one of the first time period and the second time period having a smaller number of the users larger than the incentive corresponding to the other of the first time period and the second time period having a larger number of the users.

10. A battery replacement control system comprising:

an electric vehicle on which a first battery is mounted;

at least one battery replacement apparatus including at least one second battery interchangeable with the first battery; and a battery replacement control device that manages the battery replacement apparatus, wherein the battery replacement control device includes:

a communication unit that acquires situation information about a situation in the battery replacement apparatus; and a processor that adjusts, based on the situation information, an incentive given to a user of the battery replacement apparatus, wherein:

the situation information includes information that the battery replacement apparatus is required to charge the second battery using power from a power system, and information about an SOC of the second battery, the processor determines a number of the second batteries having a full SOC is larger than or equal to a predetermined first threshold value, the processor makes, in response to determining the number of the second batteries having a full SOC is larger than or equal to a predetermined first threshold value, the incentive when an SOC of the electric vehicle is smaller than or equal to a predetermined second threshold value larger than the incentive when the SOC of the electric vehicle is larger than the predetermined second threshold value, and the processor gradually adjusts the incentive in a stepwise manner as the SOC of the electric vehicle decreases.

* * * * *